US007510666B2

(12) United States Patent
Walton et al.

(10) Patent No.: US 7,510,666 B2
(45) Date of Patent: Mar. 31, 2009

(54) TIME CONTINUOUS ION-ION PLASMA

(75) Inventors: Scott G. Walton, Burke, VA (US);
Robert Meger, Crofton, MD (US);
Richard Fernsler, Annanadale, VA (US); Darrin Leenhardt, Gaithersburg, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 271 days.

(21) Appl. No.: 11/239,432

(22) Filed: Sep. 20, 2005

(65) Prior Publication Data

US 2006/0021968 A1 Feb. 2, 2006

Related U.S. Application Data

(62) Division of application No. 10/672,269, filed on Sep. 26, 2003, now SIR No. H2212.

(51) Int. Cl.
*C23F 1/00* (2006.01)

(52) U.S. Cl. .......................................... 216/63
(58) Field of Classification Search ........................ None
See application file for complete search history.

(56) References Cited

U.S. PATENT DOCUMENTS

| | | | | |
|---|---|---|---|---|
| 3,913,320 A | * | 10/1975 | Reader et al. ................. 60/202 |
| 4,422,013 A | * | 12/1983 | Turchi et al. ............ 315/111.81 |
| 4,496,449 A | * | 1/1985 | Rocca et al. ............ 204/298.36 |
| 4,509,451 A | | 4/1985 | Collins et al. |
| 4,656,430 A | * | 4/1987 | Olson ........................ 315/500 |
| 4,749,910 A | * | 6/1988 | Hara et al. ............. 315/111.81 |
| 4,933,551 A | * | 6/1990 | Bernius et al. .............. 250/288 |
| 5,089,747 A | * | 2/1992 | Koshiishi et al. ....... 315/111.81 |
| 5,244,698 A | * | 9/1993 | Ishihara et al. .............. 427/563 |
| 5,326,981 A | * | 7/1994 | Hara et al. ............. 250/492.21 |
| 5,413,663 A | | 5/1995 | Shimizu et al. |
| 5,468,955 A | * | 11/1995 | Chen et al. ................... 250/251 |
| 5,518,572 A | * | 5/1996 | Kinoshita et al. ...... 156/345.34 |
| 5,539,274 A | * | 7/1996 | Araki et al. .............. 313/362.1 |
| 5,580,429 A | * | 12/1996 | Chan et al. ............. 204/192.38 |
| 5,601,653 A | | 2/1997 | Ito |
| 5,607,509 A | * | 3/1997 | Schumacher et al. ... 118/723 FE |
| 5,639,308 A | | 6/1997 | Yamazaki et al. |
| 5,667,650 A | * | 9/1997 | Face et al. ............. 204/298.07 |
| 5,969,470 A | * | 10/1999 | Druz et al. ............... 313/359.1 |
| 5,983,828 A | | 11/1999 | Savas |
| 6,054,063 A | | 4/2000 | Ohtake et al. |
| 6,146,135 A | * | 11/2000 | Watanabe et al. ........... 432/221 |
| 6,150,755 A | * | 11/2000 | Druz et al. ............... 313/359.1 |

(Continued)

*Primary Examiner*—Allan Olsen
(74) *Attorney, Agent, or Firm*—John J. Karasek; Amy Ressing

(57) ABSTRACT

An ion-ion plasma source, that features a processing chamber containing a large concentration of halogen or halogen-based gases. A second chamber is coupled to the processing chamber and features an electron source which produces a high energy electron beam. The high energy electron beam is injected into the processing chamber where it is shaped and confined by a means for shaping and confining the high energy electron beam. The high energy electron beam produced in the second chamber when injected into the processing chamber ionizes the halogen gas creating a dense, ion-ion plasma in the processing chamber that is continuous in time.

20 Claims, 2 Drawing Sheets

U.S. PATENT DOCUMENTS

| | | |
|---|---|---|
| 6,171,451 B1 * | 1/2001 | Miley et al. .................. 204/173 |
| 6,348,158 B1 * | 2/2002 | Samukawa .................... 216/67 |
| 6,410,450 B2 | 6/2002 | Kitagawa |
| 6,459,066 B1 * | 10/2002 | Khater et al. .......... 219/121.41 |
| 6,511,575 B1 * | 1/2003 | Shindo et al. .................. 355/30 |
| 6,875,700 B2 | 4/2005 | Kanakasabapathy et al. |
| 6,905,626 B2 * | 6/2005 | Westerman et al. ........... 216/67 |
| 6,924,455 B1 * | 8/2005 | Chen et al. ............. 219/121.41 |
| 6,949,478 B2 * | 9/2005 | Ohmi et al. .................. 438/774 |
| 7,161,112 B2 * | 1/2007 | Smith et al. ............ 219/121.57 |
| 7,166,816 B1 * | 1/2007 | Chen et al. ............. 219/121.41 |
| 7,223,449 B2 * | 5/2007 | Hori et al. ................... 427/569 |
| 7,223,914 B2 * | 5/2007 | Zuppero et al. ............. 136/253 |
| 7,232,767 B2 * | 6/2007 | George et al. ............... 438/714 |
| 2002/0114898 A1 | 8/2002 | Karner et al. |
| 2002/0139658 A1 * | 10/2002 | Kanakasabapathy et al. .......................... 204/164 |
| 2002/0163289 A1 * | 11/2002 | Kaufman et al. ......... 313/361.1 |
| 2003/0073278 A1 * | 4/2003 | Ohmi et al. ................. 438/225 |
| 2003/0184205 A1 * | 10/2003 | Johnson .................... 313/359.1 |
| 2004/0055995 A1 * | 3/2004 | Westerman et al. ............. 216/2 |
| 2004/0134430 A1 * | 7/2004 | Hass et al. ............. 118/723 EB |
| 2005/0206018 A1 * | 9/2005 | Ohmi et al. ........... 257/E21.525 |
| 2007/0194252 A1 * | 8/2007 | Horsky et al. .......... 250/492.21 |

\* cited by examiner

TIME CONTINUOUS ION-ION PLASMA

This is a Divisional Application of application Ser. No. 10/672,269 filed on Sep. 26, 2003 now U.S. Pat. No. H,002,212.

BACKGROUND OF THE INVENTION

1. Field of the Invention

This invention relates in general to the field of material processing and in particular to the field of using ion-ion plasma source for etching materials.

2. Description of Related Art

Plasmas are widely used to modify the surface properties of materials and are now indispensable in etching sub-micron features. These features are created using a mask to define the feature, reactive neutrals (radicals) to attack the unmasked areas chemically, and energetic ions to remove the debris and provide directionality. The plasma provides both the ions and radicals. In conventional etchers the ions are almost always positive and are accelerated onto the material by an electric field. Because most materials being etched are poor conductors, a negative current must accompany the positive ion current, to avoid charging the surface. The simplest solution is to apply rf fields that drive positive ions into the material during one part of the rf cycle and negatively charged particles during the other part. The rf frequency most commonly used is 13.56 MHz.

Conventional etchers use electromagnetic fields to heat plasma electrons to ionize a background gas, and the plasmas thus formed necessarily contain large numbers of free electrons. In electronegative gases, some of the electrons attach to the molecules to form negative ions, but the electrons continue to carry most of the negative rf current because the ions are much heavier and less mobile. Moreover, the electrons generate an electrostatic field that prevents negative ions from leaving the plasma. The positive ions and current carriers are now directed toward the material, deeper and narrower channels can be formed using ion-ion plasmas. The aspect ratio ultimately achievable is then limited by chemical etching from the isotropic radicals alone. This limit, which has yet to be reached in present-day etchers, is approached with ion-ion plasmas provided the ions are cold an traverse the rf sheath while suffering few collisions.

Conventional electromagnetic discharge sources use hot electrons to generate a discharge and thus naturally generate electron ion plasmas. These sources include capacitively coupled discharges, inductively coupled discharges, helicons, surface waves, and electron-cyclotron-resonance reactors. However, if the electromagnetic heating fields are turned off, the plasma will convert into an ion-ion plasma in many of the halogen-based gases commonly used for etching. This is because, the disassociative attachment rate rises, in these gases, as the electrons temperature drops, and thus the electrons attach during the afterglow ("off" phase) to form negative ions. Pulsing any conventional source can thus produce an ion-ion plasma late in the afterglow. When the heating fields are on, the electrons are hot and produce-an electron-ion plasma. When the heating fields are off, the electrons cool, the plasma decays, and an ion-ion plasma eventually forms. However, because the electrons are hotter and more mobile than the ions, this conversion typically occurs only late in the afterglow when the electron density has fallen to several orders of magnitude below the ion density. Only at that point are negative ions able to leave the plasma.

The Charged Particle Physics Branch (Code 6750) at the Naval Research Laboratory has developed a plasma source for etching called the Large Area Plasma Processing System (LAPPS). This system is the subject of U.S. Pat. Nos. 5,182,496 and 5,874,807, both of which are incorporated herein by reference, in their entireties. This plasma source uses a magnetically confined, sheet electron beam to ionize a background gas and produce a planar electron/ion plasma. Electron beams exhibit high ionization and dissociation efficiency of the background gas. In addition, the plasma production process is largely independent of the ionization energies of the gas or the reactor geometry. Since the plasma volume is limited only by beam dimensions, the usable surface area of the plasma thus can exceed that of other plasma sources.

Although pulsing a conventional plasma source can produce ion-ion plasmas, the technique suffers from several serious limitations. One limitation is that hot electrons drive the ion flux during the electron-ion phase, whereas cold ions drive the ion flux during the ion-ion phase. As a result, the ion flux during the electron-ion phase is orders of magnitude larger than the ion flux during the ion-ion phase. In addition, the ion-ion phase persist for only a brief portion of the afterglow and therefore for an even shorter portion of the total period. The net result is that most of the etching occurs during the electron-ion phase rather than during the ion-ion phase. The useful duty cycle and efficiency of ion-ion etching from conventional, pulsed sources is thus low. Nevertheless, despite these limitations, pulsed plasmas have been shown to improve etch quality.

Therefore, it would be desirable to produce an ion-ion plasma with a high degree of control that is continuous in time.

SUMMARY OF THE INVENTION

The above described disadvantages are overcome and advantages realized by the method for producing a time continuous ion-ion plasma within a chamber comprising at least one halogen-based gas and a non-halogen-based gas. The method includes producing a high energy electron beam in the chamber, colliding the electron beam with the halogen gas within the chamber, ionizing and dissociating the halogen gas to generate the time continuous ion-ion plasma.

Disclosed is a method of applying a magnetic field to the high energy electron beam in the chamber to maintain the electron beam thickness over a beam distance. The high energy electron beam is injected into the processing chamber where it is shaped and confined by a means for shaping and confining the high energy electron beam. The high energy electron beam produced in the second chamber when injected into the processing chamber ionizes the halogen gas creating a dense ion-ion plasma in the processing chamber that is continuous in time.

Also disclosed is a method for creating an ion-ion plasma continuous in time comprising a processing chamber containing a large concentration of at least one halogen gas and a second chamber coupled to the processing chamber. Creating a high energy electron beam in the second chamber, injecting the high energy electron beam into the processing chamber, shaping the high energy electron beam injected into the processing chamber with a magnetic field. Wherein the high energy electron beam injected into the processing chamber ionizes the halogen gas creating a dense ion-ion plasma in the processing chamber that is continuous in time.

Additional aspects, advantages and novel features of the invention are set forth in part in the description which follows, and in part will become apparent to those skilled in the art upon examination of the following or may be learned by practice of the invention. The aspects and advantages of the invention may be realized and attained by means of the instrumentalities and combinations particularly pointed out in the appended claims.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Figure 1:
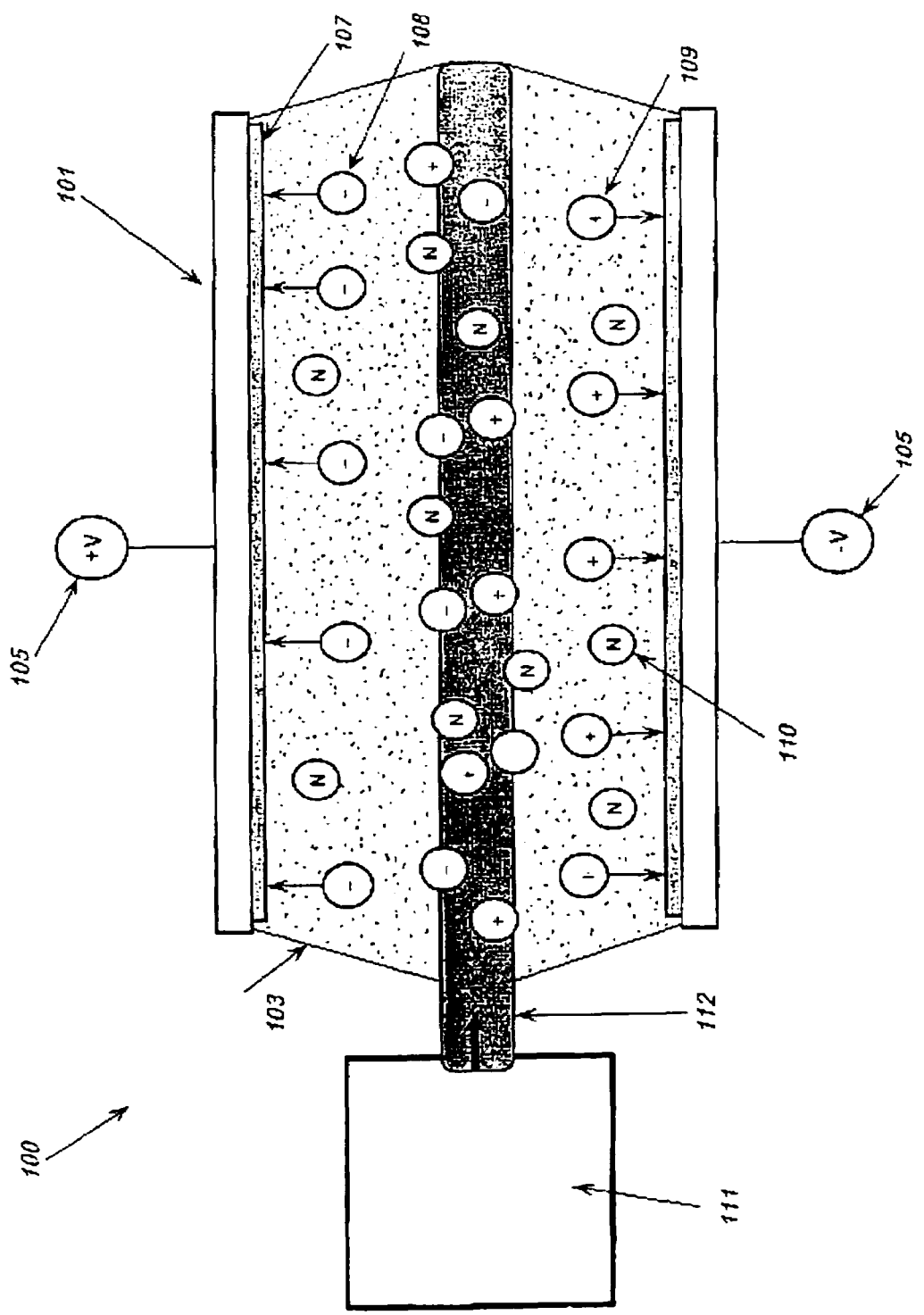
FIG. 1 illustrates an apparatus for producing an ion-ion plasma continuously in time in accordance with an embodiment of the present invention.

Referring to the figures wherein like reference numbers denote like elements, FIG. 1 shows an example embodiment of a Continuous Ion-Ion Plasma Source (CIIPS), an apparatus for producing an ion-ion plasma 100 that is continuous in time.

As shown in FIG. 1, plasma source 100 features a processing chamber comprising 101, having therein a large concentration of a halogen-based gas. A second chamber 111 is coupled to the processing chamber 101 and contains therein an electron source which provides a high energy electron beam 112, in the second chamber 111. Processing chamber 101 features means for shaping the high energy electron beam which in the example embodiment is a longitudinal magnetic field applied to the surface of the chamber wall in the direction of propagation. The longitudinal magnetic field generally is externally generated, and applied to keep the beam from expanding and striking the substrate, and to keep the beam current density, and thus the plasma density approximately constant as the beam propagates, and to retard the outward flow of plasma electrons. In an example embodiment, the magnetic field is produced by positioning magnetic field coils, or possibly permanent magnets, along to direction of electron beam propagation.

In operation the high energy electron beam 112 produced in the second chamber 111 is injected into the processing chamber 101 and is confined transversely by the magnetic field. The confined high energy electron beam 112 in the processing chamber 101 ionizes the gases creating a dense, ion-ion plasma 103 in the processing chamber. The ion-ion plasma is produced continuously in time. The high energy electron beam 112 injected into the processing chamber 101 creates a ion-ion plasma 103 by dissociating the molecules of the halogen-based gas into a group of cold plasma electrons, neutral radicals and positive ions 109. Specifically, the plasma electrons and positive ions 109 are created through ionization, while neutral radicals are created through the disassociation of the halogen molecules. The cold plasma electrons (1eV) created in the plasma attach to halogen molecules to form negative ions 108. This produces a dense plasma 103 that features a large concentration of positive ions 109, negative ions 108 and neutral radicals 110.

The processing chamber features two or more planar substrate stages (not shown). These substrate stages are closely spaced to provide room for the electron beam to pass between them. The material to be processed 107 is placed on one or more of the stages and an rf voltage 105 is applied as necessary to accelerate the ions, 108 and 109 onto the material being processed 107.

The distance from the electron beam 112 to the substrate stage provides additional control over the particle fluxes, separate from the beam and gas parameters. Typically, the stages sit 1 cm or more from the electron beam 112 in order to prevent the beam 112 from striking the material being processed 107.

CIIPS employs a magnetically confined sheet electron beam to ionize and dissociate a background gas. CIIPS produces a continuous ion-ion plasma rather than an electron-ion plasma, by using a gas mixture containing a large concentration of halogen gas with a large attachment cross section at electron energies below 1 eV. Candidate gases include $SF_6$, (sulfur hexafluoride), $Cl_2$ (chlorine) and $F_2$ (fluorine).

The high energy electron beam is confined transversely by a longitudinal magnetic field to maintain plasma uniformity over a large area, to prevent the beam from striking the substrate, and to reduce the flux of plasma electrons to the substrates. These features minimize the loss of electron energy.

The electron beam may be produced in a chamber separated from the processing chamber by differential pumping as indicated in FIG. 1. This feature helps to minimize gas contamination and improves processing control. The high energy electron beam within the second chamber is approximately 2000 eV. This energy level can vary depending on the gas pressure and the system length. The beam energy is selected so that the beam electrons can propagate to the end of the processing region without losing their full energy. Typically this will require an electron energy of 1-5 keV, depending on the gas pressure and species in the processing chamber.

In a preferred embodiment the high energy electron beam employed by the disclosed ion-ion method has an energy level approaching 2000 eV. As such, the ionization energies of the gases can differ widely, since the electron beam has sufficient energy to ionize and dissociate any and all gases. Moreover, the ionization and disassociation rates of a given gas constituent are largely determined by the concentration of that constituent for a given electron beam, which allows the processing chamber to be populated with a wide mixture of halogen gases. By contrast, prior methods were often restricted to the use of halogen gases with similar electron bond strength. In the present invention, the option of varying the gas mixture provides direct control over the plasma constituents and the plasma chemistry.

The beam energy is nominally a few keV, the beam current density is typically 0.1 $A/cm^2$ or less, the gas pressure in the processing chamber is typically 50 mtorr, and the magnetic field along the beam is around 200 G. The beam is normally a few cm thick and arbitrarily wide, as determined by the chamber size and application. The magnetic field is applied to keep the beam thickness approximately constant over the beam range. For the parameters specified the beam range is 1 m or more, and the ion density produced is as high as $2 \times 10^{12}$ $cm^{-3}$. CIIPS can thus generate dense, uniform, ion-ion plasmas over processing areas as large as 1 $m^2$ or more.

In a preferred embodiment the electron beam is shaped into a thin sheet. The sheet beam can be produced in a variety of ways, and two methods have been successfully demonstrated and are shown in FIGS. 2 and 3.

Figure 2:
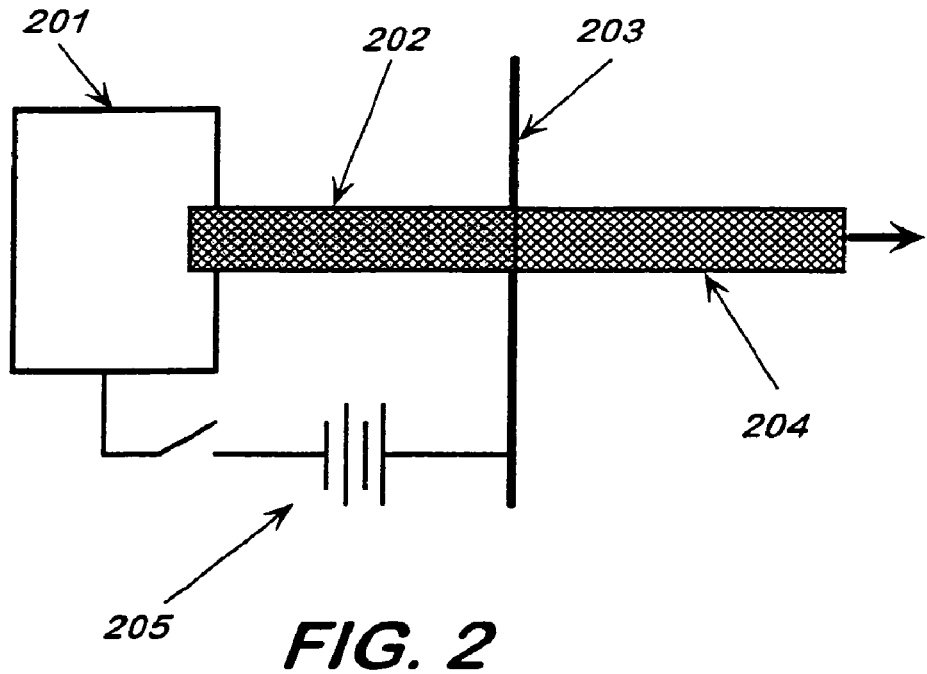
FIG. 2. illustrates a first embodiment of a beam source for producing a high energy electron beam in accordance with an embodiment of the present invention.

FIG. 2 shows an example beam source used to produce a high energy electron beam. Referring to FIG. 2, a high voltage source 305 provides a high voltage discharge 202 is struck between a long, hollow cathode 201 and a slotted anode 203. A portion of the discharge current emerges in the form of an energetic electron beam 204 that passes through the slot into the processing chamber, while the remainder of the discharge current flows to the anode 203.

Figure 3:
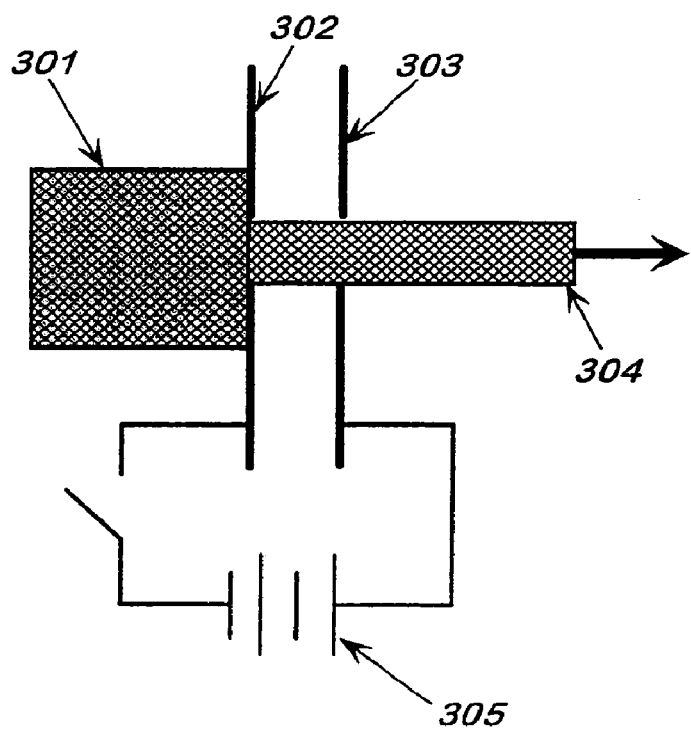
FIG. 3 illustrates a second embodiment of a beam source for producing a high energy electron beam in accordance with an embodiment of the present invention.

FIG. 3 shows a second example beam source for producing a high energy electron beam 304. Referring to FIG. 3, electrons are extracted from a dense plasma or other electron source 301 and then accelerated by a high voltage 305 applied to a nearby grid 302 or slot 303. Both methods are capable of generating electron beams 304 of the required energy and current density at gas pressures below 300 mtorr.

Referring again to FIG. 1, the magnetic field is applied to the electron beam 112 to prevent the beam from striking the stage or the material being processed 107, and to keep the beam current density approximately constant over the propagation length, and to reduce the outward flow of plasma electrons. A field of around 200 G keeps the beam gyroradius under 1 cm, which is generally sufficient for CIIPS. The field strongly retards the flow of plasma electrons but has little effect on the massive ions, and as a result, negative ions can escape the plasma and strike the substrate 107 more easily than in other plasma sources.

As the electron beam 112 collides with the halogen and other gas molecules, it generates ions, electrons, and radicals through ionization and dissociation. At the same time, gas flow keeps the gas cold and the degree of ionization and dissociation low. The plasma electrons therefore cool rapidly and attach to form negative ions, thereby producing a weakly ionized but dense plasma 103, consisting mainly of positive 109 and negative ions 108 and neutral radicals 110. As these particles diffuse out of the plasma, they etch any reactive material they contact.

The etch rate may be increased by placing the material on a stage to which rf is applied at a frequency approximately <1 MHz. The rf voltage increases the energy of the ions (to typically 20 eV or more) striking the material. At low gas pressure, the rf sheath is thinner than the ion mean free path, and thus isotropic radicals together with energetic and highly anisotropic, positive and negative ions strike the material. As previously noted, the ion flux from an ion-ion plasma is much smaller than that from an electron-ion plasma of the same density, and thus the etch rate is smaller as well. The reduction in etch rate is partially offset by a reduction in substrate heating, and the etch rate can be increased to some extent by raising the beam current to increase the plasma density.

The method for creating an ion-ion plasma continuous in time comprises a processing chamber containing a large concentration of at least one halogen gas, and a second chamber coupled to the processing chamber. The method includes creating a high energy electron beam in the second chamber and injecting the high energy electron beam into the processing chamber. After the electron beam is injected into the chamber the next step is shaping the high energy electron beam injected into the processing chamber with a magnetic field. The high energy electron beam injected into the processing chamber ionizes the halogen gas, creating a dense ion-ion plasma in the processing chamber that is continuous in time.

The high energy electron beam injected into the processing chamber creates a ion-ion plasma by dissociating the molecules of the halogen gas into a group of cold plasma electrons, neutral radicals and positive ions, and the cold plasma electrons created in the plasma attach to halogen molecules forming negative ions producing a dense plasma comprising a large concentration of positive ions and negative ions and neutral radicals. The high energy electron beam within the second chamber is approximately 2000 ev. The processing chamber contains a multitude of halogen gases.

The high energy electron beam is shaped and confined by a magnetic field which provides uniformity over a large area and minimizes the loss of electron energy.

Although this invention his been described in relation to the exemplary embodiment's thereof, it is well understood by those skilled in the art that other variations and modifications can be affected on the preferred embodiment without departing from scope and spirit of the invention as set fourth in the claims.

What is claimed is:

1. A method for producing a time continuous ion-ion plasma within a processing chamber comprising:
   providing at least one halogen gas including halogen gas molecules within said processing chamber;
   producing a high energy electron beam in the processing chamber, wherein said beam is time continuous;
   shaping said electron beam with a magnetic field; and
   ionizing and dissociating the halogen gas with said high energy electron beam to generate the time continuous ion-ion plasma comprising negative ions, positive ions and neutral radicals.

2. The method as claimed in claim 1, wherein the processing chamber includes non-halogen based gases.

3. The method of claim 1, wherein said ionizing and disassociating step further includes dissociating the halogen gas molecules including cold plasma electrons, and wherein the cold plasma electrons attach to the halogen gas molecules forming negative ions producing the time continuous plasma comprising positive ions, negative ions and neutral radicals.

4. The method of claim 1, wherein said time continuous ion-ikon plasma has an electron temperature of about 1 eV or less.

5. The method of claim 1, wherein the high energy electron beam within the processing chamber is up to approximately 3000ev.

6. The method of claim 1, wherein said high energy electron beam ranges from about 1 keV to about 5 keV.

7. The method of claim 1, wherein said high energy electron beam has a beam energy is selected to allow beam electrons to propagate to the end of the processing region without losing full energy.

8. The method of claim 1, wherein said halogen gas is selected from the group comprising $SF_6$, $Cl_2$ and $F_2$.

9. The method of claim 1, wherein said shaping of the high energy electron beam in the processing chamber is configured to maintain an electron beam thickness over a range of the high energy electron beam.

10. The method of claim 9, wherein the high energy electron beam thickness includes approximately 3 centimeters.

11. The method of claim 9, wherein the range of the high energy electron beam has a range of approximately one meter.

12. A method for etching a substrate material disposed on a stage within a processing chamber comprising:
   providing at least one halogen as including halogen gas molecules within said processing chamber;

coating selected areas of the substrate material with a masking material and leaving other areas of the substrate material exposed;

producing a time continuous high energy electron beam in response to an electron source being continually energized, wherein said high energy electron beam ionizes and dissociates the halogen gas producing plasma comprising negative ions and positive ions; and allowing the negative ions and positive ions to diffuse out of said plasma wherein said negative ions and positive ions etch the exposed area of the substrate material.

13. The method of claim 12, wherein said time continuous ion-ion plasma has an electron temperature of about 1 eV or less.

14. The method as claimed in claim 12, wherein the high energy electron beam thickness includes approximately 3 centimeters.

15. The method as claimed in claim 12, wherein the range of the high energy electron beam includes approximately one meter.

16. The method as claimed in claim 12, wherein the chamber includes non-halogen based gases.

17. The method of claim 12, wherein said high energy electron beam ranges from about 1 keV to about 5 keV.

18. The method of claim 12, wherein said high energy electron beam has a beam energy is selected to allow beam electrons to propagate to the end of the processing region without losing full energy.

19. The method of claim 12, wherein said halogen gas is selected from the group comprising $SF_6$, $Cl_2$ and $F_2$.

20. The method of claim 12 further comprising applying an rf to the stage at a frequency of about 1 MHz or less.

* * * * *